United States Patent
Arnold et al.

(10) Patent No.: US 8,049,555 B2
(45) Date of Patent: Nov. 1, 2011

(54) LOW LEAKAGE SAMPLING SWITCH

(75) Inventors: Matthias Arnold, Freising (DE);
Bernhard Ruck, Freising (DE); Aymen Landoulsi, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/705,281

(22) Filed: Feb. 12, 2010

(65) Prior Publication Data
US 2010/0201433 A1 Aug. 12, 2010

(51) Int. Cl.
*G05F 1/10* (2006.01)
*G05F 3/02* (2006.01)

(52) U.S. Cl. ............ 327/542; 327/91; 327/94; 327/554; 323/313

(58) Field of Classification Search .................... 327/91, 327/542, 554; 323/313
See application file for complete search history.

(56) References Cited

U.S. PATENT DOCUMENTS
6,603,295 B2 * 8/2003 Reithmaier et al. .......... 323/313

FOREIGN PATENT DOCUMENTS
DE 102009008757.5 2/2009

OTHER PUBLICATIONS
Office Action—German Patent Application No. 10 2009 008 757.5.
* cited by examiner

*Primary Examiner* — Lincoln Donovan
*Assistant Examiner* — John Poos
(74) *Attorney, Agent, or Firm* — Robert D. Marshall, Jr.; W. James Brady; Frederick J. Telecky, Jr.

(57) ABSTRACT

An electronic device includes a cascade of a plurality of transistors. Each transistor of the cascade receives an input voltage at a first terminal of its source/drain channel and receives a sampling clock signal at a control gate. The second terminal of the source/drain path of a first transistor drives a sampling capacitor. The second terminal of the source/drain channel of each subsequent transistor is connected to a backgate of a previous transistor. The backgate of the last transistor is connected to a supply voltage level. The second terminals of the subsequent transistors may be connected to corresponding buffer capacitors. The backgate of the last transistor may be supplied with the input during sampling and the supply voltage level at other times.

10 Claims, 2 Drawing Sheets

LOW LEAKAGE SAMPLING SWITCH

CLAIM OF PRIORITY

This application claims priority under 35 U.S.C. 119(a) to German Patent Application No. 10 2009 008 757.5 filed Feb. 12, 2009.

TECHNICAL FIELD OF THE INVENTION

The technical field of this invention is an electronic device with a switch for sampling an input voltage on a sampling capacitor.

BACKGROUND OF THE INVENTION

Low leakage switches are of major importance in sample and hold systems with long hold times. Leakage currents become the dominant error source at elevated temperatures. Many electronic devices such as integrated semiconductor circuits sample an input or reference voltage on a capacitor. One side of the sampling capacitor is coupled to an input voltage through a sampling switch. The sampling switch is closed (conducting) and the sampling capacitor is charged during a sampling phase or sampling time. After sampling the voltage on the sampling capacitor, the sampling switch is opened (not conducting).

One purpose of sampling a voltage level is to extend the time period, known as hold phase or hold time, during which the sampling switch is not conducting. This aims to preserve the sampled voltage on the sampling capacitor as long as possible. Thus the charge on the sampling capacitor should be preserved. However, many characteristics of real integrated circuits adversely affect charge preservation. A major drawback is the leakage current through the sampling switches. A conventional approach to overcome this effect increases the capacitance value of the sampling capacitor. This increases the size of the capacitor. This is similar to increasing chip area and thereby cost of the integrated circuit. Larger capacitors can further increase power consumption if the same speed is maintained as for smaller capacitors. Other solutions aim to improve the sampling switches.

Sampling switches are implemented with transistors. In a CMOS technology a switch may be an NMOS, a PMOS transistor or a combination of both referred to as a transmission gate. MOS transistors have P-doped regions and N-doped regions which can form parasitic diodes. One of these diodes is referred to as backgate diode. Such a backgate diode couples the source or the drain of the transistor to the channel located opposite to the control gate. In a simplified model of a real MOS transistor a backgate diode may be located between drain and source of the transistor and the channel. In order to avoid leakage currents through these backgate diodes, the voltage level on the backgate or the channel is controlled to reversely bias the backgate diodes. Even with reverse bias a minimum saturation current can flow through the backgate diode and the voltage level on the sampling capacitor can change significantly.

FIG. 1 shows a prior art switching circuit designed to minimize charge loss on a sampling capacitor. This prior art circuit is disclosed in U.S. Pat. No. 6,603,295. The transistors and switches are controlled with signals from control circuit 2. The main sampling switch is implemented with transistor P1. The sampling capacitor is capacitor CS. Reference voltage generator 1 provides a reference voltage level at node VREFOUT. This is sampled and held on sampling capacitor CS. VREFOUT is also sampled through transistor P2 on a second capacitor C2. If the voltage level on capacitor C2 is equal to VREFS (both may initially be almost equal to VREFOUT) there is no voltage drop across backgate diode D1. Therefore there is no current through diode D1. There is also no voltage drop across backgate diode D2. The voltage level on capacitor C2 must also be preserved. Transistor P2 also has backgate diodes D3 and D4. Backgate diodes D3 and D4 are reverse biased to minimize leakage current. Therefore, the channel (backgate) of transistor P2 is adjusted to a specific voltage level. This is performed with bipolar transistor T1, current source CS and switch S2. If S2 is closed (conducting) the voltage level at the channel of transistor P2 is pulled to ground. If S2 is open (not conducting) the voltage rises close to supply voltage level VDD.

Although the circuit of FIG. 1 reduces the leakage current though backgate diodes of transistors P1 and P2 to a certain extent, charge preservation is not high enough for up-to-date low power applications with very long hold times. The circuit requires an extra bipolar transistor and consumes additional current through transistor T1.

SUMMARY OF THE INVENTION

It is an object of the present invention to provide an electronic device and a method for low leakage sampling with a better performance than prior art circuits.

In one aspect of the invention, an electronic device is provided which includes a switch. The switch comprises a cascade of transistors. The cascade of transistors has a first and a last transistor. The transistors of the cascade are all coupled to receive an input voltage at a first side of their channels. This is either at the drain junction or source junction. A side of a channel may refer to either the drain junction of the source junction of the transistor if a MOSFET is used. They also receive a sampling clock signal at their control gates. All transistors are switched basically simultaneously. A first transistor of the cascade is coupled at a second side of its channel (source or drain junction) to a sampling capacitor. Each subsequent transistor of the cascade is coupled with a second side of its channel to a backgate of a previous transistor. The last transistor of the cascade is coupled at its backgate to a supply voltage level. For this circuit ground is considered a supply voltage level. The backgate diodes of the transistors are configured as a chain or a series of backgate diodes. The last backgate diode is coupled to a supply voltage level. The first backgate diode, which is the backgate diode of the first transistor is coupled to the sampling capacitor. This aspect of the invention delays the process of parasitically discharging or charging the sampling capacitor. This permits the hold time to be substantially prolonged. Since only the last backgate diode is coupled to supply voltage level, the tap node, which is a node also coupled to a drain or source junction of a transistor of the cascade, between the last backgate diode and the previous backgate diode has to be charged. Only after charging the tap node, will the current through the next backgate diode rise and charge the next tap node. The charge and voltage level on the sampling capacitor is only affected when the first backgate diode (the backgate diode of the first transistor of the cascade) starts charging or discharging the sampling capacitor. Using a cascade of transistors according to this invention is extremely efficient since the current through a reverse biased backgate diode depends exponentially on the voltage drop across the diode.

The transistors of the cascade are preferably of the same type, that is either PMOS transistors or NMOS transistors. This provides that the backgate diodes leak towards reverse biasing rather than forward biasing.

In an aspect of the invention, at least one of the transistors except the first transistor of the cascade is coupled at the second side of its channel to a buffer capacitor. This preserves the voltage level at the tap node.

In an embodiment, the buffer capacitor may have a capacitance value that is smaller than the capacitance value of the sampling capacitor. This is based upon the recognition that the current through a reverse biased backgate diode exponentially depends on the voltage across the diode. According to this aspect of the invention it is possible to substantially decrease the capacitance values and therefore the sizes of the sampling capacitor and the buffer capacitor.

In another embodiment, some or all of the cascade transistors may have buffer capacitors connected to the second side of their channels. The electronic device may then include these buffer capacitors. The buffer capacitors which are coupled to transistors of the cascade closer to the last transistor can have smaller capacitance values than those earlier in the cascade and closer to the sampling transistor. The sampling capacitor may then further be scaled down. Although an exponential relationship exists between the capacitor sizes, due to the exponential dependency of the saturation current through reverse biased backgate diodes, this relationship may not directly be applied to the scaling of the capacitors. The size of the capacitors may be subject to other design rules and design limits. However, substantial area reduction for integrated circuits may always be achieved.

In an aspect of the invention, the leakage process of the sampling capacitor may be made an approximately linear behavior. This can be achieved, if the capacitors are scaled in accordance with the exponential behavior of the saturation currents through the backgate diodes within the technological limits an approximation of an exponential scale down of buffer capacitors towards the last transistor of the cascade can be used.

In an embodiment, an electronic device may comprise a switch with a cascade of MOS transistors. Each of the MOS transistors can be coupled to receive at one of its drain or source junctions an input voltage and at a control gate a sampling clock signal. A first transistor of the cascade may be coupled with the other source or drain junction to a sampling capacitor. A second transistor of the cascade may then be coupled with its other source or drain junction to a first buffer capacitor and to a backgate of the first transistor. Furthermore, a third transistor of the cascade may be coupled with its other source or drain junction to a backgate of the second transistor and with its backgate to a supply voltage level. The transistors of the cascade may be switched simultaneously to sample the input voltage. Buffer capacitors may be provided and coupled to the backgates of the transistors except for the last transistor of the cascade. The input voltage is then sampled on the sampling capacitor and also on the buffer capacitors.

The backgate diodes of the transistors of the cascade except the last transistor are therefore not reversely biased but they experience no voltage drop immediately after sampling. Due to the last transistor having its backgate coupled to supply voltage, leakage currents through the series of backgate diodes increase slowly from the last to the first transistor of the cascade. The capacitance values of the buffer capacitors can be substantially smaller than the capacitance value of the sampling capacitor.

According to an aspect of the invention, the backgate of the last transistor may be coupled to a tap node between the channels of two more transistors. These transistors may be switched alternately so as to couple the backgate either to the supply voltage level during a hold phase or to the input voltage during the sampling phase. This helps to reduce the on resistance of the last transistor during sampling.

In another aspect of the invention, an input buffer capacitor may be provided coupled to buffer the input voltage. This capacitor reduces channel leakage of the transistors of the cascade and disables the backgate diodes between the input node and the backgates of the transistors.

The invention provides a method of operating a switch. An input voltage is sampled on a sampling capacitor. Simultaneously, the input voltage is sampled on tap nodes of a chain of backgate diodes of a cascade of transistors. The first backgate diode of the chain is coupled to the sampling capacitor and the last backgate diode of the chain is coupled to a supply voltage level during a hold phase.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
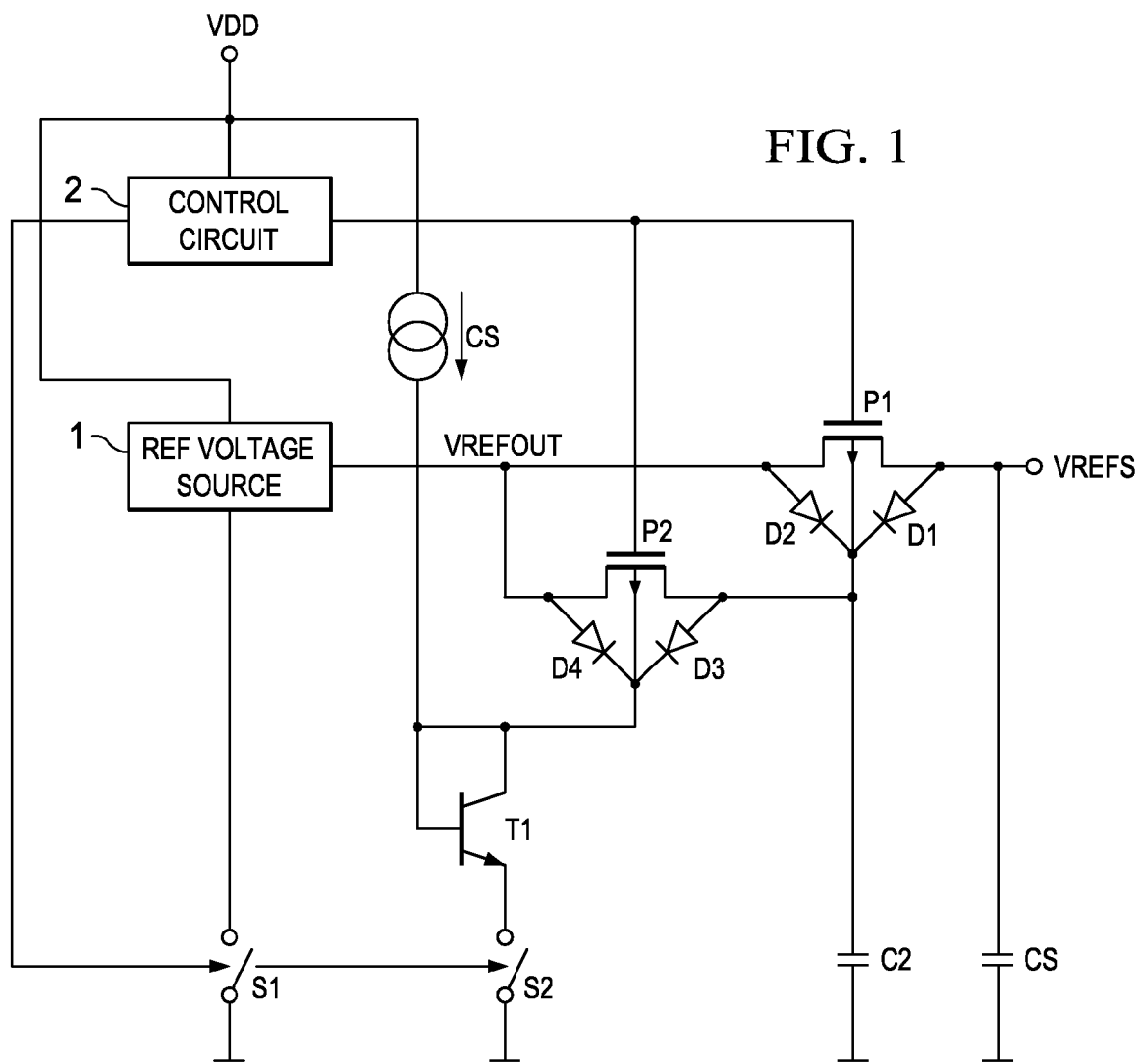
FIG. 1 shows a simplified circuit diagram of a low leakage switch according to the prior art.
Figure 2:
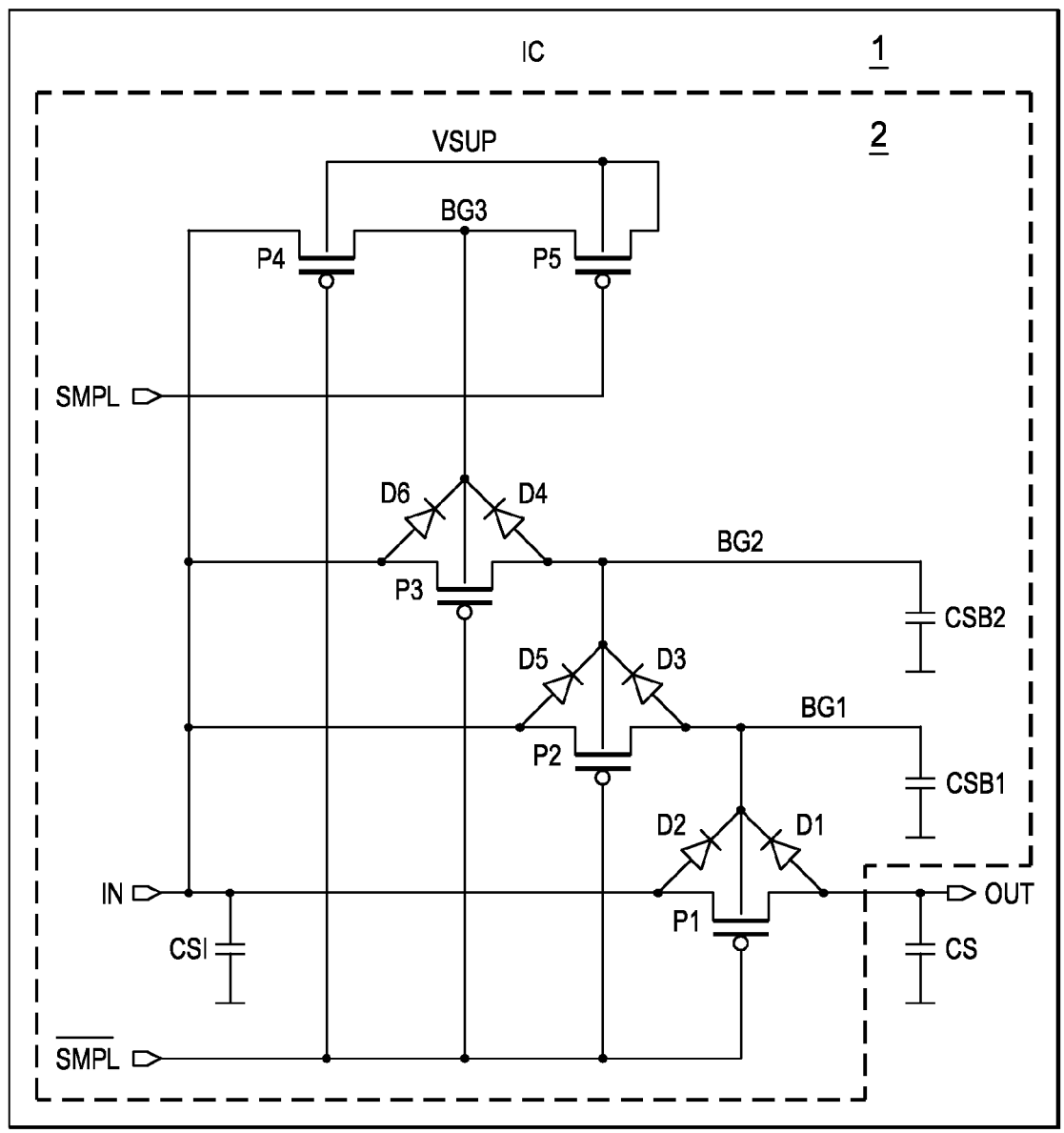
FIG. 2 shows a simplified circuit diagram of an electronic device according to an embodiment of the invention.

FIG. 2 show a simplified circuit diagram of an electronic device according to the present invention. FIG. 2 shows a low leakage switch in accordance with an embodiment of the invention.

The electronic device IC 1, such as an integrated circuit, chip or microcontroller, includes switch 2 having a cascade of MOS transistors P1, P2 and P3. Each of the MOS transistors P1, P2 and P3 is coupled to input node to receive the input voltage IN. The control gates are controlled with sampling clock signal $\overline{SMPL}$ which is the inverse of sampling clock signal SMPL. The sampling signal SMPL defines a sampling phase of a duration TON and a hold phase of a duration TOFF. During the sampling phase SMPL=1 (logic high) and $\overline{SMPL}$=0. During the hold phase SMPL=0 (logic low) and $\overline{SMPL}$=1.

The first transistor P1 of the cascade has its source/drain junction connected to sampling capacitor CS. The second transistor P2 of the cascade has its source/drain junction connected to first buffer capacitor CSB1 and to a backgate BG1 (bulk of transistor P1) of first transistor P1. Third transistor P3 of the cascade has its source/drain junction coupled to the backgate BG2 of second transistor P2 and with its own backgate BG3 connected to a tap node between backgate bias transistors P4 and P5. Transistor P5 connects backgate BG3 of third transistor P3 to supply voltage level VSUP during the hold phase. Note that if transistors P1, P2 and P3 are NMOS transistors, this supply voltage level may be ground. Transistor P4 connected the backgate BG3 of transistor P3 to the input voltage IN during the sampling phase. All transistors P1 to P3 of the cascade are simultaneously switched. Buffer capacitors CSB1 and CSB2 are connected to respective backgate BG1 of transistor P1 and backgate BG2 transistors P2. Only the backgate BG3 of the last transistor P3 of the cascade is coupled to either the input voltage during the sampling phase or the supply voltage level during the hold phase. The input voltage IN is sampled on the sampling capacitor CS and also on the buffer capacitors CSB1 and CSB2. The capacitance values and the therefore their sizes in chip area of the buffer capacitors CSB1 and CSB2 can be substantially smaller than the capacitance value and the size of the sampling capacitors. Furthermore, buffer capacitor CSB2 can be substantially smaller than buffer capacitor CSB1.

Backgate diodes D1 and D3 of respective transistors P1 and P2 of the cascade are not reversely biased during the hold phase. They have no voltage drop at least initially. Because last transistor P3 has its backgate coupled to supply voltage VSUP, leakage currents start to flow slowly from last transistor P3 through backgate diode D4 to first transistor P1 and eventually through backgate diode D1 to sampling capacitor CS. Due to the exponential dependency of voltage drop across any diode D1, D3 and D4 and the current through the diode, the cascade configuration of transistors P1, P2 and P3, as well as backgate diodes D1, D3 and D4 and the buffer capacitors CS, CSB1 and CSB2, the effect of leakage currents on the sampling capacitor CS is substantially delayed. This is also true for D2, D5, D6 but less relevant during hold phase. Over a given time period of the hold phase, the voltage change on capacitor CS is minimized.

Input buffer capacitor CSI is coupled to buffer the input voltage IN. This input buffer capacitor CSI reduces channel leakage of the transistors P1, P2 and P3 of the cascade and disables the backgate diodes D2, D5 and D6 between the input node IN and the backgates BG1, BG2 and BG3 of the transistors.

During the sampling phase when SMPL=1 (logic high), transistors P1, P2, P3 and P4 are conducting and capacitors CS, CSB1 and CSB2 are charged to the input voltage level IN. Furthermore, the backgate BG3 of transistor P3 is coupled to input voltage IN. The input voltage is also sampled and stored on input capacitor CSI. This reduces channel leakage of P1, P2 and P3 from the capacitors CS, CSB1 and CSB2 to the input IN.

During the hold phase SMPL=0 (logic low), both backgate diodes D6 and D4 are reversely biased as the tap node between transistors P4 and P5, to which backgate BG3 is coupled, is tied to positive supply voltage level VSUP. The voltage on CSB2 and therefore the backgate voltage start to change due to a leakage current through diode D4. Backgate diode D3 of transistor P2 is initially zero biased and the voltage on backgate BG1 remains unchanged. Backgate diode D5 is also initially zero biased. However, the voltage on backgate BG1 of transistor P1 changes slowly after the backgate voltage of transistor P2 starts changing. There is a significant delay between the first increase of voltage on buffer capacitor CSB2 and a change on CSB1. The backgate diodes D1 and D2 of transistor P1 are also initially zero biased having no voltage drop across them. This situation lasts longer than for transistor P2 and voltage degradation on buffer capacitor CS begins only with a significant delay due to a leakage current through backgate diode D1.

Although FIG. 2 shows an embodiment with PMOS transistors the invention is not limited to a specific type of transistor. The PMOS transistors P1 to P5 may be replaced with NMOS transistors. When using NMOS transistors the power supply VSUP should be ground and the sampling clock signals should be inverted. The respective drain and source junctions may be exchanged. The invention may also be used with transmission gates where NMOS and PMOS transistors are combined. The specific implementation depends on the signal level IN to be sampled, the available supply voltage and the desired gate drive or overdrive voltage.

In an advantageous embodiment with a cascade of NMOS transistors, a backgate of a transistor of the cascade may be switched between different voltages with a rather steep slope. Using a steep slope has a positive impact on the held output voltage.

Furthermore, it is also advantageous to let the backgate diode leak from zero voltage toward reverse bias to avoid any risk of forward biasing the diode. This requirement is met with a low leakage switch implemented according to aspects of the invention, since the backgate of a PMOS transistor such as transistor P1 is coupled to another PMOS transistor which is the same conductivity type transistor. The cascade of backgate diodes D1, D3 and D4 is finally coupled to positive supply voltage level. Therefore, the backgate diodes tend towards reverse biasing. In this aspect of the invention, the cascade advantageously includes a cascade of same types of transistors (either NMOS or PMOS) which are coupled to the respective backgates of the transistors of the cascade.

In another advantageous embodiment, two cascades may be employed, one using PMOS transistors and the other using NMOS transistors. These two cascades may be combined to form a single switch. This switch may then cover the full signal range similar to a transmission gate.

In another embodiment of the invention, the voltage coefficients of the sampling and/or buffer capacitors are considered and the buffer capacitors, the transistors and the sampling capacitor may be dimensioned accordingly. The capacitors and the transistors may advantageously be dimensioned in accordance with the leakage of the capacitors.

In other preferred embodiments of the invention, the total number of source and/or drain junctions of transistors which are connected to the sampling capacitor is minimized. This helps to reduce further undesired parasitic effects.

The low leakage switch according to the invention optimizes hold performance while minimizing costs and chip area. Due to the exponential characteristic of leakage current cascading, the backgate sampling according to the invention allows the capacitance of the backgate sampling capacitors to be minimized.

Although the invention has been described hereinabove with reference to a specific embodiment, it is not limited to this embodiment and no doubt further alternatives will occur to the skilled person that lie within the scope of the invention as claimed.

What is claimed is:

1. An electronic device including a switch comprising:
a sampling capacitor having a first terminal and a second terminal connected to ground;
a cascade of a plurality of transistors from a first transistor to a last transistor, each transistor having a first terminal of a source/drain channel receiving an input voltage, a second terminal of said source/drain channel, a backgate terminal and a control gate receiving a sampling clock signal, a first transistor of said cascade having said second terminal of said source/drain channel coupled to said first terminal of said sampling capacitor, each subsequent transistor of the cascade excluding said first transistor having said second terminal of said source/drain channel connected to said backgate terminal of a previous transistor in said cascade and said last transistor of said cascade having said backgate connected to a supply voltage level; and
a first backgate bias transistor having a first terminal of a source/drain channel receiving said input voltage, a second terminal of said source/drain channel connected to said backgate terminal of said last transistor of said cascade and a control gate receiving said sampling clock signal; and
a second backgate bias transistor having a first terminal of a source/drain channel connected to said backgate terminal of said last transistor of said cascade, a second terminal of said source/drain channel receiving said supply voltage level and a control gate receiving an inverse of said sampling clock signal.

2. The electronic device of claim 1, further comprising:
at least one buffer capacitor having a first terminal and a second terminal connected to ground; and
wherein at least one of said transistors of said cascade excluding said first transistor of said cascade having said second terminal of said source/drain channel connected said first terminal of a corresponding one of said at least one buffer capacitor.

3. The electronic device of claim 2, wherein:
each of said at least one buffer capacitor having a capacitance smaller than a capacitance of said sampling capacitor.

4. The electronic device of claim 1, further comprising:
a plurality of buffer capacitors one less in number than a number of said transistors of said cascade, each buffer capacitor having a first terminal and a second terminal connected to ground; and
each of said transistors of said cascade excluding said first transistor of said cascade having said second terminal of said source/drain channel connected said first terminal of a corresponding one of said plurality of buffer capacitors.

5. The electronic device of claim 4, wherein:
each of said plurality of buffer capacitors having a capacitance smaller than a capacitance of said buffer capacitor connected to said previous transistor of said cascade, said buffer transistor of a second transistor of said cascade having a capacitance smaller than a capacitance of said sampling capacitor.

6. An electronic device including a switch comprising:
a sampling capacitor having a first terminal and a second terminal connected to ground;
a cascade of a plurality of transistors from a first transistor to a last transistor, each transistor having a first terminal of a source/drain channel receiving an input voltage, a second terminal of said source/drain channel, a backgate terminal and a control gate receiving a sampling clock signal, a first transistor of said cascade having said second terminal of said source/drain channel coupled to said first terminal of said sampling capacitor, each subsequent transistor of the cascade excluding said first transistor having said second terminal of said source/drain channel connected to said backgate terminal of a previous transistor in said cascade and said last transistor of said cascade having said backgate connected to a supply voltage level; and
an input buffer capacitor having a first terminal receiving said input voltage an a second terminal connected to ground.

7. The electronic device of claim 6, further comprising:
at least one buffer capacitor having a first terminal and a second terminal connected to ground; and
wherein at least one of said transistors of said cascade excluding said first transistor of said cascade having said second terminal of said source/drain channel connected said first terminal of a corresponding one of said at least one buffer capacitor.

8. The electronic device of claim 7, wherein:
each of said at least one buffer capacitor having a capacitance smaller than a capacitance of said sampling capacitor.

9. The electronic device of claim 6, further comprising:
a plurality of buffer capacitors one less in number than a number of said transistors of said cascade, each buffer capacitor having a first terminal and a second terminal connected to ground; and
each of said transistors of said cascade excluding said first transistor of said cascade having said second terminal of said source/drain channel connected said first terminal of a corresponding one of said plurality of buffer capacitors.

10. The electronic device of claim 9, wherein:
each of said plurality of buffer capacitors having a capacitance smaller than a capacitance of said buffer capacitor connected to said previous transistor of said cascade, said buffer transistor of a second transistor of said cascade having a capacitance smaller than a capacitance of said sampling capacitor.

* * * * *